(12) United States Patent
Chang et al.

(10) Patent No.: US 9,709,640 B2
(45) Date of Patent: Jul. 18, 2017

(54) SINGLE BRIDGE MAGNETIC FIELD SENSOR

(71) Applicants: Ching-Ray Chang, Taipei (TW); Jen-Tzong Jeng, Kaohsiung (TW); Jen-Hwa Hsu, Taipei (TW); Chih-Cheng Lu, Taipei (TW); Bor-Lin Lai, Kaohsiung (TW); Van-Su Luong, Kaohsiung (TW)

(72) Inventors: Ching-Ray Chang, Taipei (TW); Jen-Tzong Jeng, Kaohsiung (TW); Jen-Hwa Hsu, Taipei (TW); Chih-Cheng Lu, Taipei (TW); Bor-Lin Lai, Kaohsiung (TW); Van-Su Luong, Kaohsiung (TW)

(73) Assignee: National Taiwan University, Taipei (TW)

( * ) Notice: Subject to any disclaimer, the term of this patent is extended or adjusted under 35 U.S.C. 154(b) by 135 days.

(21) Appl. No.: 14/840,475

(22) Filed: Aug. 31, 2015

(65) Prior Publication Data
US 2017/0059668 A1 Mar. 2, 2017

(51) Int. Cl.
*G01R 33/09* (2006.01)
*G01R 33/00* (2006.01)
*G01D 5/14* (2006.01)

(52) U.S. Cl.
CPC .......... *G01R 33/09* (2013.01); *G01R 33/0094* (2013.01); *G01D 5/145* (2013.01)

(58) Field of Classification Search
CPC .... G01R 5/145; G01R 33/09; G01R 33/0094; G01R 33/0035

USPC ......................................................... 324/252
See application file for complete search history.

(56) References Cited

U.S. PATENT DOCUMENTS

| 2005/0140363 | A1* | 6/2005 | Grimm | G01R 33/09 |
| | | | | 324/207.21 |
| 2013/0176022 | A1* | 7/2013 | Lee | G01R 33/096 |
| | | | | 324/252 |
| 2013/0300402 | A1* | 11/2013 | Liu | G01R 33/09 |
| | | | | 324/202 |

\* cited by examiner

*Primary Examiner* — Melissa Koval
*Assistant Examiner* — Courtney McDonnough
(74) *Attorney, Agent, or Firm* — Rosenberg, Klein & Lee

(57) ABSTRACT

A single bridge magnetic field sensor includes a fluxguide mounted to a surface of a substrate. A bridge unit includes first, second, third, and fourth magnetoresistive elements mounted around the fluxguide and mounted on the surface of the substrate. A switching circuit is electrically connected to two voltage inputs, two grounding terminals, two voltage output terminals, and the four magnetoresistive elements. The switching circuit can proceed with circuit switching according to a magnetic field in each axis direction to be measured, thereby changing electrical connection between the voltage inputs, the grounding terminals, the voltage output terminals, and the four magnetoresistive elements. A measuring unit is electrically connected to the two voltage output terminals and the four magnetoresistive elements. The magnetoresistances of the four magnetoresistive elements measured by the measuring unit and output voltages of the voltage output terminals can be used to obtain a magnetic field measurement result.

6 Claims, 4 Drawing Sheets

SINGLE BRIDGE MAGNETIC FIELD SENSOR

BACKGROUND OF THE INVENTION

The present invention relates to an instrument for measuring magnetic fields and, more particularly, to a single bridge magnetic field sensor.

A magnetic field sensor can detect magnetic field vectors in a space. However, indicating the direction of a magnetic field requires measurement on the same location to determine three magnetic field components orthogonal to one another. Although various vector magnetic field sensors are available, the measurement ranges of the magnetic field strength of these sensors are different. For example, Hall sensors are suitable for determining magnetic fields of 10 μT to 1 T, whereas reluctive sensors can detect magnetic fields of 1 mT to 0.1μ. Thus, different magnetic fields require different types of vector sensors. Furthermore, the three component sensors of currently available vector sensors are independent and are located in different locations, such that the whole device is large. Furthermore, the magnetic fields to be determined are not located on the same horizontal reference plane, leading to numerical errors in the magnetic field vector strength. Thus, a need exists for continuous improvement and development of vector magnetic field sensors.

BRIEF SUMMARY OF THE INVENTION

A single bridge magnetic field sensor according to the present invention includes a substrate and a fluxguide directly or indirectly mounted to a surface of the substrate. The fluxguide is a rectangular prism. A bridge unit includes a first magnetoresistive element, a second magnetoresistive element, a third magnetoresistive element, and a fourth magnetoresistive element mounted around four sides of the fluxguide in sequence and mounted on the surface of the substrate. The pinning directions of the first and third magnetoresistive elements are away from the fluxguide. The pinning directions of the second and fourth magnetoresistive elements are towards the fluxguide. A switching circuit is electrically connected to two voltage inputs, two grounding terminals, two voltage output terminals, and the first, second, third, and fourth magnetoresistive elements. The switching circuit is configured to proceed with circuit switching according to a magnetic field in each axis direction to be measured, thereby changing electrical connection between the two voltage inputs, the two grounding terminals, the two voltage output terminals, and the first, second, third, and fourth magnetoresistive elements. A measuring unit is electrically connected to the two voltage output terminals and the first, second, third, and fourth magnetoresistive elements. The measuring unit is configured to measure a magnetoresistance of each of the first, second, third, and fourth magnetoresistive elements. The magnetoresistances of the first, second, third, and fourth magnetoresistive elements and output voltages of the two voltage output terminals are adapted to be used to obtain a magnetic field measurement result.

The magnetic field is guided by the fluxguide to each magnetoresistive element. The switching circuit changes the electrical connection between the two voltage inputs, the two grounding terminals, the two voltage output terminals, and the four magnetoresistive elements according to the magnetic field in the axis direction to be detected. The magnetic field in each axis direction can be obtained by the magnetoresistances of the four magnetoresistive elements and the output voltages of the two voltage output terminals. In comparison with the conventional technology, the present invention uses only one bridge unit to measure the magnetic field in each axis direction. Thus, the overall volume of the single bridge magnetic field sensor can be reduced as small as less than 1 mm$^3$.

The single bridge magnetic field sensor can further include four first flux concentrators respectively outside of the first, second, third, and fourth magnetoresistive elements.

The single bridge magnetic field sensor can further include a second flux concentrator mounted between the fluxguide and the substrate.

Each of the four first flux concentrators can be rectangular in cross section, and the second flux concentrator can be square in cross section.

Each of the first, second, third, and fourth magnetoresistive elements can be a giant magnetoresistance spin valve or a tunnel magnetoresistance spin valve.

The present invention will become clearer in light of the following detailed description of illustrative embodiments of this invention described in connection with the drawings.

DETAILED DESCRIPTION OF THE INVENTION

Figure 1:
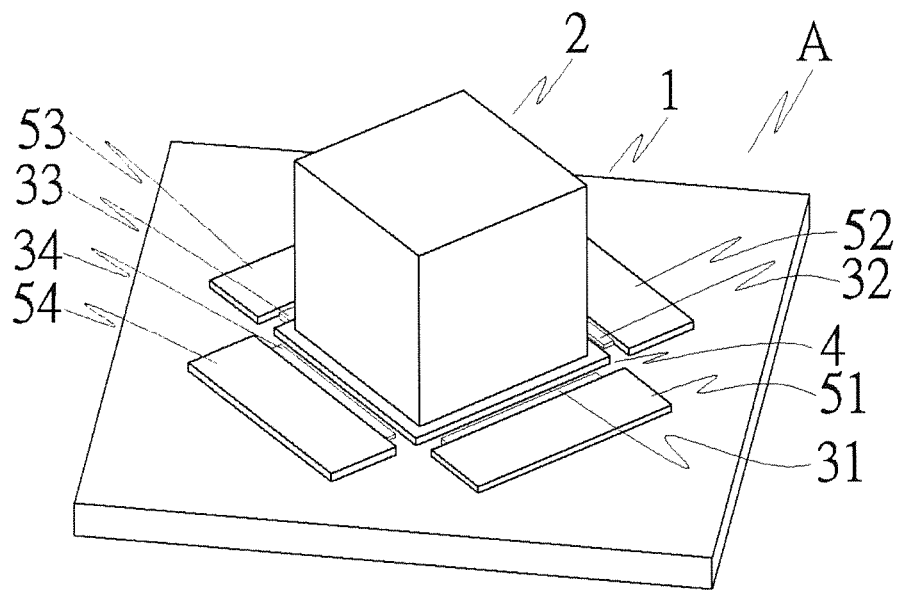
FIG. 1 is a perspective view of a single bridge magnetic field sensor according to the present invention.

With reference to FIG. 1, a single bridge magnetic field sensor A according to the present invention includes a substrate 1. The substrate 1 can be of a type for producing magnetoresistive type sensing elements, but not limited to a silicon substrate.

Figure 3:
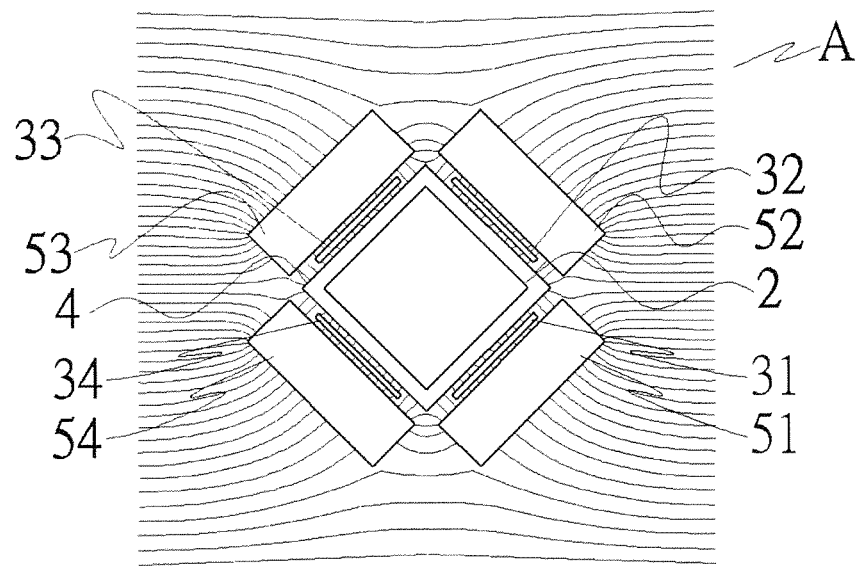
FIG. 3 is a diagrammatic view illustrating flux lines of the single bridge magnetic field sensor in an X-axis magnetic field or a Y-axis magnetic field.
Figure 4:
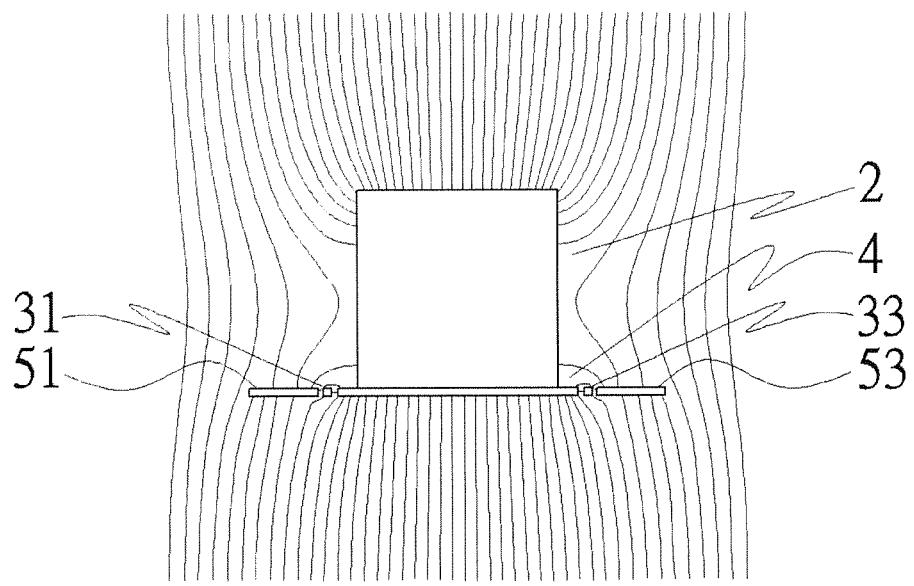
FIG. 4 is a diagrammatic view illustrating flux lines of the single bridge magnetic field sensor in a Z-axis magnetic field.

The single bridge magnetic field sensor A further includes a fluxguide 2. According to the form shown, the fluxguide 2 is a rectangular prism directly or indirectly mounted to a surface of the substrate 1. The fluxguide 2 is preferably made of a magnetically soft material having high magnetic permeability and low hysteresis, such as Ni—Zn ferrite or Ni—Fe alloy. With reference to FIGS. 3 and 4, the fluxguide 2 an refract a horizontal plane (including an X-axis direction and a Y-axis direction) of an externally applied magnetic field to a direction detectable by each magnetoresistive element 31, 32, 33, 34 mentioned hereinafter and can guide the externally applied magnetic field in a Z-axis direction to a horizontal direction. To make the flux density stronger and more uniform during the sensing operation of the single bridge magnetic field sensor A according to the present invention, the fluxguide 2 is indirectly mounted to the surface of the substrate 1, and a second flux concentrator 4 is mounted between the fluxguide 2 and the substrate 1. The second flux concentrator 4 is square in cross section to have the best magnetic field uniformity. Furthermore, the flux density is in direct proportion to the strength of the magnetic field component in the direction of the plane.

The single bridge magnetic field sensor A further includes a bridge unit 3 having a first magnetoresistive element 31, a second magnetoresistive element 32, a third magnetoresistive element 33, and a fourth magnetoresistive element 34 mounted around four sides of the fluxguide 2 in sequence and mounted on the surface of the substrate 1. The pinning directions of the first and third magnetoresistive elements 31 and 33 are away from the fluxguide 2. The pinning directions of the second and fourth magnetoresistive elements 32 and 34 are towards the fluxguide 2. Each of the first, second, third, and fourth magnetoresistive elements 31, 32, 33, and 34 is a giant magnetoresistance (GMR) spin valve or a tunnel magnetoresistance (TMR) spin valve.

To make the flux density stronger and more uniform during the sensing operation of the single bridge magnetic field sensor A according to the present invention, four first flux concentrators 51, 52, 53, 54 are provided and respectively located outside of the first, second, third, and fourth magnetoresistive elements 31, 32, 33, and 34. Thus, each of the first, second, third, and fourth magnetoresistive elements 31, 32, 33, and 34 is located between the fluxguide 2 and one of the four first flux concentrators 51, 52, 53, and 54. Each of the four first flux concentrators 51, 52, 53, and 54 is rectangular in cross section to have the best magnetic field uniformity. Furthermore, the length and the direction of a long side of each of the four first flux concentrators 51, 52, 53, and 54 respectively correspond to the length and the direction of a long side of the second flux concentrator 4. Furthermore, the flux density is in direct proportion to the strength of the magnetic field component in the direction of the plane.

The single bridge magnetic field sensor A further includes a switching circuit 6 electrically connected to two voltage inputs 61, two grounding terminals 62, two voltage output terminals 63, and the first, second, third, and fourth magnetoresistive elements 31, 32, 33, and 34. The switching circuit 6 is configured to proceed with circuit switching according to the magnetic field in each axis direction (the X-axis direction, Y-axis direction, Z-axis direction) to be measured, thereby changing electrical connection between the two voltage inputs 61, the two grounding terminals 62, the two voltage output terminals 63, and the first, second, third, and fourth magnetoresistive elements 31, 32, 33, and 34. Operation patterns of the switching circuit 6 will be set forth hereinafter.

The single bridge magnetic field sensor A further includes a measuring unit 7 electrically connected to the two voltage output terminals 63 and the first, second, third, and fourth magnetoresistive elements 31, 32, 33, and 34. The measuring unit 7 is configured to measure the magnetoresistance of each of the first, second, third, and fourth magnetoresistive elements 31, 32, 33, and 34. The magnetoresistances of the first, second, third, and fourth magnetoresistive elements 31, 32, 33, and 34 and output voltages of the two voltage output terminals 63 can be used to obtain a magnetic field measurement result.

Figure 2:
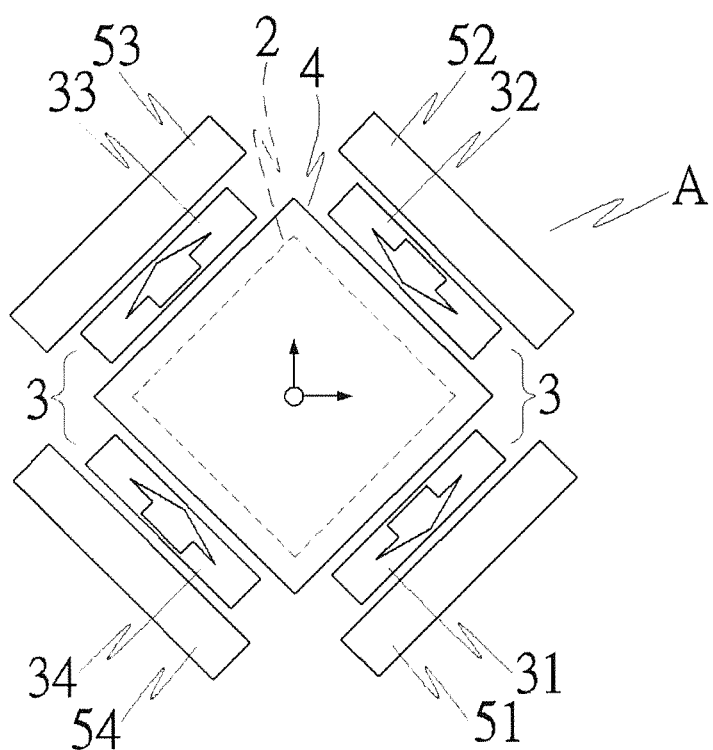
FIG. 2 is a top view of the single bridge magnetic field sensor according to the present invention, illustrating the pinning directions.

With reference to FIGS. 1, 2, and 4, in manufacture of the single bridge magnetic field sensor A according to the present invention, the first, second, third, and fourth magnetoresistive elements 31, 32, 33, and 34 can be formed on the surface of the substrate 1 by magnetron sputtering and lithography. Then, a magnetically soft film of Ni—Fe or Co—Fe is produced by electro casting and is used to produce each of the first flux concentrators 51, 52, 53, and 54 and the second flux concentrator 4. Then, an anhysteretic ferrite material is cut to form the fluxguide 2, and the fluxguide 2 is bonded to the surface of the second flux concentrator 4, forming the single bridge magnetic field sensor A according to the present invention. The first flux concentrators 51, 52, 53, and 54 and the second flux concentrator 4 made by electro casting have accurate sizes and high positioning accuracy. Since the fluxguide 2 requires a larger height to obtain the flux refraction effect of the planar magnetic field and since the thickness produced by electro casting is limited by the time costs, the advantageous method for the fluxguide 2 is cutting and bonding. FIG. 4 shows an analytical result of the flux distribution. The design of the first flux concentrators 51, 52, 53, and 54 and the second flux concentrator 4 increase the uniformity of the flux density to compensate the errors resulting from bonding.

In comparison with the conventional technology requiring four bridge units, the single bridge magnetic field sensor A according to the present invention uses only one bridge unit 3 to cooperate with the fluxguide 2, and the switching circuit 6 is used to proceed with circuit switching for changing the electrical connection between the elements. Thus, the magnetic field in each axis direction can be measured, providing advantages including high magnetic field sensitivity, three-axis detection, and a small volume.

The operation patterns and the magnetic field measurement operations of the switching circuit 6 during the magnetic field detection in each axis direction of the single bridge magnetic field sensor A according to the present invention will now be set forth.

Figure 5:
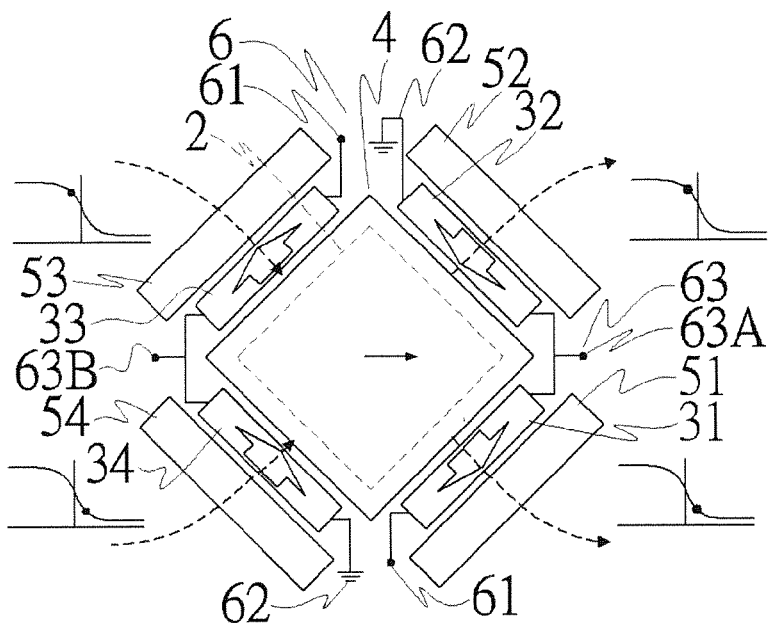
FIG. 5 is a diagrammatic view illustrating the magnetoresistance change of each magnetoresistive element of the single bridge magnetic field sensor in the X-axis magnetic field.

With reference to FIG. 5 and further to FIGS. 3 and 6-8, when the magnetic field component Bx to be measured is in the X-axis direction, the arrangement of the fluxguide 2, the first, second, third, and fourth flux concentrators 51, 52, 53, and 54, and the second flux concentrator 4 permits each of the first, second, third, and fourth magnetoresistive elements 31, 32, 33, and 34 to detect uniform flux density, and the magnetic field direction of the flux density relative to the pinning directions of the first, second, third, and fourth magnetoresistive elements 31, 32, 33, and 34 are forward, reverse, reverse, and forward, respectively, such that the magnetoresistance changes of the first, second, third, and fourth magnetoresistive elements 31, 32, 33 and 34 are decrease, increase, increase, and decrease, respectively. In this case, the two voltage inputs 61 are electrically connected to the first magnetoresistive element 31 and the fourth magnetoresistive element 34, relatively. The second magnetoresistive element 32 and the third magnetoresistive element 33 are electrically connected to the two grounding terminals 62, respectively. Due to the magnetic field component Bx, the total output voltage of the two voltage output terminals 63A and 63B can be expressed by the following equation (1):

$$V_x(B_x) = V_a - V_b = V_{cc}\left(\frac{R_2}{R_1+R_2} - \frac{R_4}{R_3+R_4}\right) \quad (1)$$

wherein $V_a$ and $V_b$ are the output voltages of the two voltage output terminals 63A and 63B, $R_1$ is the resistance of the first magnetoresistive element 31, $R_2$ is the resistance of the second magnetoresistive element 32, $R_3$ is the resistance of the third magnetoresistive element 33, $R_4$ is the resistance of the fourth magnetoresistive element 34, and $V_{cc}$ is the input voltage of each of the two voltage inputs 61. When the magnetic field component Bx is equal to zero, all of the resistances of the first, second, third, and fourth magnetoresistive elements 31, 32, 33, and 34 are zero $R_0$ (zero magnetic field magnetoresistance) ($R_1=R_2=R_3=R_4=R_0$). In this case, the output voltage of the bridge unit 3 is zero.

On the other hand, when the magnetic field component $B_x$ is not equal to zero, the magnetoresistances of the first, second, third, and fourth magnetoresistive elements 31, 32, 33, and 34 are respectively decreased, increased, increased, and decreased by $\Delta R$ ($R_1=R_0-\Delta R$, $R_2=R_0+\Delta R$, $R_3=R_0+\Delta R$, and $R_4=R_0-\Delta R$). In this case, the output voltage of the bridge unit 3 is $V_x(B_x)=V_{cc}\Delta R/R_0$.

When the magnetic field $B_y$ is not equal to zero, the magnetoresistances of the first, second, third, and fourth magnetoresistive elements 31, 32, 33, and 34 are respectively changed as follows: $R_1=R_0-\Delta R$, $R_2=R_0-\Delta R$, $R_3=R_0+\Delta R$, and $R_4=R_0+\Delta R$. According to equation (1), the output voltage of the bridge unit 3 is zero.

When the magnetic field component B, is not equal to zero, the magnetoresistances of the first, second, third, and fourth magnetoresistive elements 31, 32, 33, and 34 are respectively changed as follows: $R_1=R_0+\Delta R$, $R_2=R_0-\Delta R$, $R_3=R_0+\Delta R$, and $R_4=R_0-\Delta R$. According to equation (1), the output voltage of the bridge unit 3 is zero.

Figure 6:
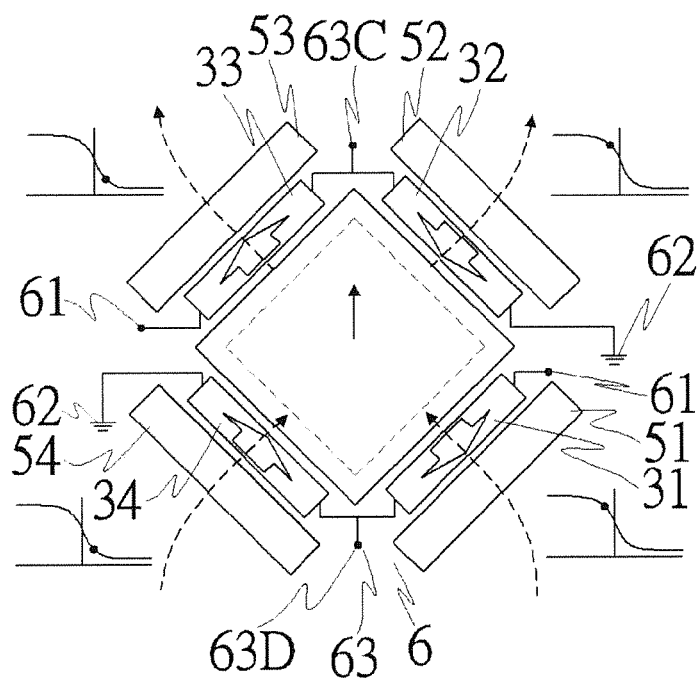
FIG. 6 is a diagrammatic view illustrating the magnetoresistance change of each magnetoresistive element of the single bridge magnetic field sensor in the Y-axis magnetic field.

With reference to FIG. 6 and further to FIGS. 3, 5, 7, and 8, when the magnetic field component By to be measured is in the Y-axis direction, the magnetic field direction of the flux density relative to the pinning directions of the first, second, third, and fourth magnetoresistive elements 31, 32, 33, and 34 are reverse, reverse, forward, and forward, respectively, such that the magnetoresistance changes of the first, second, third, and 34 are increase, increase, decrease, and decrease, respectively. In this case, the two voltage inputs 61 are electrically connected to the first magnetoresistive element 31 and the third magnetoresistive element 33, respectively. The second magnetoresistive element 32 and the fourth magnetoresistive element 34 are electrically connected to the two grounding terminals 62, respectively. Due to the magnetic field component By, the total output voltage of the two voltage output terminals 63C and 63D can he expressed h the following equation (2):

$$V_y(B_y) = V_c - V_d = V_{cc}\left(\frac{R_2}{R_2+R_3} - \frac{R_4}{R_1+R_4}\right) \quad (2)$$

wherein $V_c$ and $V_d$ are the output voltages of the two voltage output terminals 63C and 63D. When the magnetic field component By is equal to zero, all of the resistances of the first, second, third, and fourth magnetoresistive elements 31, 32, 33, and 34 are zero $R_0$ (zero magnetic field magnetoresistance) ($R_1=R_2=R_3=R_4=R_0$). In this case, the output voltage of the bridge unit 3 is zero.

On the other hand, when the magnetic field component By is not equal to zero, the magnetoresistances of the first, second, third, and fourth magnetoresistive elements 31, 32, 33, and 34 are respectively increased, increased, decreased, and decreased by $\Delta R$ ($R_1=R_0+\Delta R$, $R_2=R_0+\Delta R$, $R_3=R_0-\Delta R$, and $R_4=R_0-\Delta R$). In this case, the output voltage of the bridge unit 3 is $V_y(B_y)=V_{cc}\Delta R/R_0$.

When the magnetic field component $B_x$ is not equal to zero, the magnetoresistances of the first, second, third, and fourth magnetoresistive elements 31, 32, 33, and 34 are respectively changed as follows: $R_1=R_0-\Delta R$, $R_2=R_0+\Delta R$, $R_3=R_0+\Delta R$, and $R_4=R_0-\Delta R$. According to equation (2), the output voltage of the bridge unit 3 is zero.

When the magnetic field component B, is not equal to zero, the magnetoresistances of the first, second, third, and fourth magnetoresistive elements 31, 32, 33, and 34 are respectively changed as follows: $R_1=R_0+\Delta R$, $R_2=R_0-\Delta R$, $R_3=R_0+\Delta R$, and $R_4=R_0-\Delta R$. According to equation (2), the output voltage of the bridge unit 3 is zero.

Figure 7:
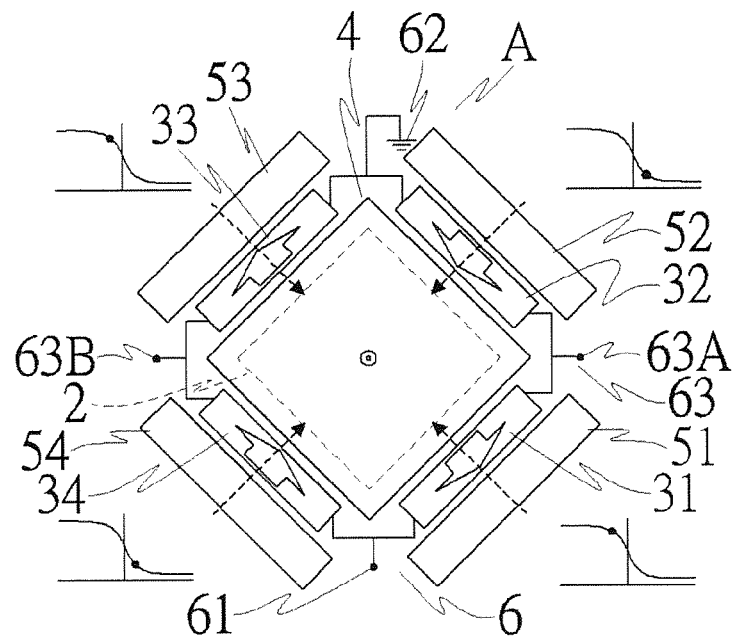
FIG. 7 is a diagrammatic view illustrating the magnetoresistance change of each magnetoresistive element of the single bridge magnetic field sensor in the Z-axis magnetic field.
Figure 8:
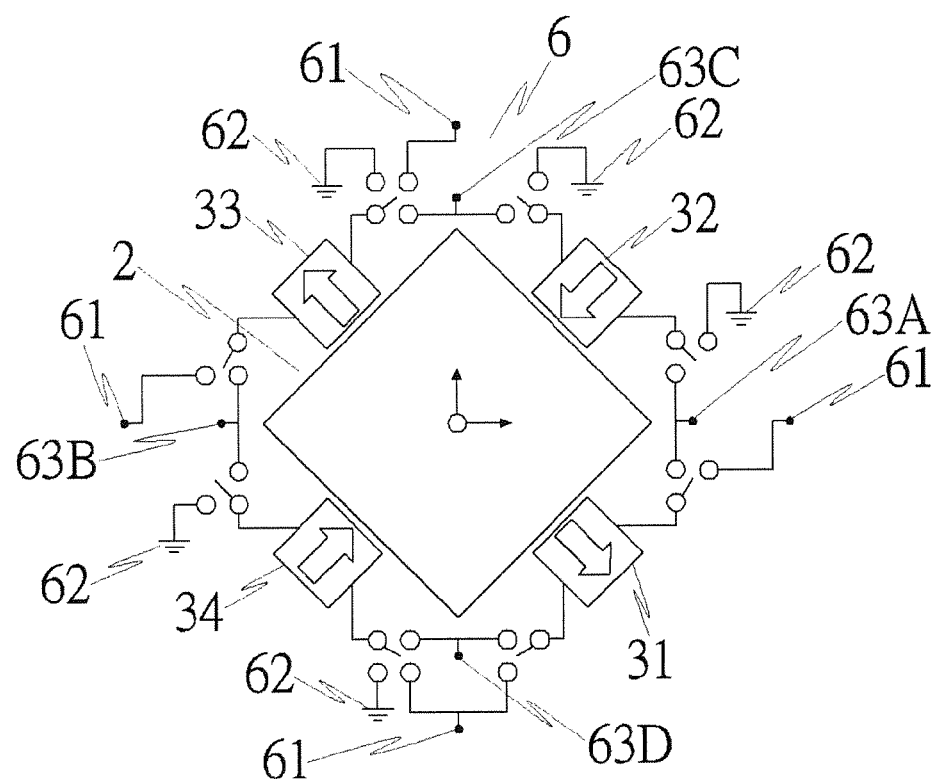
FIG. 8 is a diagrammatic view illustrating electrical connection between a switching circuit and each element of the single bridge magnetic field sensor according to the present invention.

With reference to FIG. 7 and further to FIGS. 3, 6, and 8, when the magnetic field component Bz to be measured is in the Z-axis direction, the magnetic field direction of the flux density relative to the pinning directions of the first, second, third, and fourth magnetoresistive elements 31, 32, 33, and 34 are reverse, forward, reverse, and forward, respectively, such that the magnetoresistance changes of the first, second, third, and fourth magnetoresistive elements 31, 32, 33 and 34 are increase, decrease, increase, and decrease, respectively. In this case, the two voltage inputs 61 are electrically connected to the first magnetoresistive element 31 and the fourth magnetoresistive element 34, respectively. The second magnetoresistive element 32 and the third magnetoresistive element 33 are electrically connected to the two grounding terminals 62, respectively.

Due to the magnetic field component Bz, the total output voltage of the two voltage output terminals 63A and 63B can be expressed by the following equation (3):

$$V_z(B_z) = V_b - V_a = V_{cc}\left(\frac{R_3}{R_4+R_3} - \frac{R_2}{R_1+R_2}\right) \quad (3)$$

wherein $V_a$ and $V_b$ are the output voltages of the two voltage output terminals 63A and 63B. When the magnetic field component Bz is equal to zero, all of the resistances of the first, second, third, and fourth magnetoresistive elements 31, 32, 33, and 34 are zero $R_0$ (zero magnetic field magnetoresistance) ($R_1=R_2=R_3=R_4=R_0$). In this case, the output voltage of the bridge unit 3 is zero.

On the other hand, when the magnetic field component Bz is not equal to zero, the magnetoresistances of the first, second, third, and fourth magnetoresistive elements 31, 32, 33, and 34 are respectively changed as follows: $R_1=R_0+\Delta R$, $R_2=R_0-\Delta R$, $R_3=R_0+\Delta R$, and $R_4=R_0-\Delta R$. In this case, the output voltage of the bridge unit 3 is $V_z(B_z)=V_{cc}\Delta R/R_0$.

When the magnetic field component Bx is not equal to zero, the magnetoresistances of the first, second, third, and fourth magnetoresistive elements 31, 32, 33, and 34 are respectively changed as follows: $R_1=R_0-\Delta R$, $R_2=R_0+\Delta R$, $R_3=R_0+\Delta R$, and $R_4=R_0-\Delta R$. According to equation (3), the output voltage of the bridge unit 3 is zero.

When the magnetic field component By is not equal to zero, the magnetoresistances of the first, second, third, and fourth magnetoresistive elements 31, 32, 33, and 34 are respectively changed as follows: $R_1=R_0+\Delta R$, $R_2=R_0+\Delta R$, $R_3=R_0+\Delta R$, and $R_4=R_0-\Delta R$. According to equation (3), the output voltage of the bridge unit 3 is zero.

As can be seen from the foregoing, the single bridge magnetic field sensor A according to the present invention can be switched between three circuits by the switching circuit 6 to provide three output modes represented by the above equations (1), (2), and (3), such that the magnetic field components in the three axis directions can be measured through a single bridge. The switching between the three output modes can be achieved by an analogue switch circuit or by numerical calculation using the above equations (1), (2), and (3) based on real time measurements of the magnetoresistance changes of the first, second, third, and fourth magnetoresistive elements 31, 32, 33, and 34.

Although specific embodiments have been illustrated and described, numerous modifications and variations are still possible without departing from the scope of the invention. The scope of the invention is limited by the accompanying claims.

What is claimed is:

1. A single bridge magnetic field sensor comprising:
a substrate having a surface;
a fluxguide directly or indirectly mounted to the surface of the substrate, with the fluxguide being a rectangular prism;
a bridge unit including a first magnetoresistive element, a second magnetoresistive element, a third magnetoresistive element, and a fourth magnetoresistive element mounted around four sides of the fluxguide in sequence and mounted on the surface of the substrate, with pinning directions of the first and third magnetoresistive elements being away from the fluxguide, and with pinning directions of the second and fourth magnetoresistive elements being towards the fluxguide;
a switching circuit electrically connected to two voltage inputs, two grounding terminals, two voltage output terminals, and the first, second, third, and fourth magnetoresistive elements, with the switching circuit configured to proceed with circuit switching according to a magnetic field in each axis direction to be measured, thereby changing electrical connection between the two voltage inputs, the two grounding terminals, the two voltage output terminals, and the first, second, third, and fourth magnetoresistive elements; and
a measuring unit electrically connected to the two voltage output terminals and the first, second, third, and fourth magnetoresistive elements, with the measuring unit configured to measure a magnetoresistance of each of the first, second, third, and fourth magnetoresistive elements, and with the magnetoresistances of the first, second, third, and fourth magnetoresistive elements and output voltages of the two voltage output terminals adapted to be used to obtain a magnetic field measurement result.

2. The single bridge magnetic field sensor as claimed in claim 1, further comprising four first flux concentrators respectively outside of the first, second, third, and fourth magnetoresistive elements.

3. The single bridge magnetic field sensor as claimed in claim 1, further comprising a second flux concentrator mounted between the fluxguide and the substrate.

4. The single bridge magnetic field sensor as claimed in claim 2, further comprising a second flux concentrator mounted between the fluxguide and the substrate.

5. The single bridge magnetic field sensor as claimed in claim 4, wherein each of the four first flux concentrators is rectangular in cross section, and wherein the second flux concentrator is square in cross section.

6. The single bridge magnetic field sensor as claimed in claim 1, wherein each of the first, second, third, and fourth magnetoresistive elements is a giant magnetoresistance spin valve or a tunnel magnetoresistance spin valve.

* * * * *